(12) United States Patent
Hosobata

(10) Patent No.: US 7,948,198 B2
(45) Date of Patent: May 24, 2011

(54) REACTION FORCE CANCEL SYSTEM

(75) Inventor: Takuya Hosobata, Yokosuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 373 days.

(21) Appl. No.: 12/219,846

(22) Filed: Jul. 29, 2008

(65) Prior Publication Data
US 2009/0278411 A1 Nov. 12, 2009

(30) Foreign Application Priority Data
Jul. 30, 2007 (JP) .............................. P2007-197912

(51) Int. Cl.
*H02K 41/00* (2006.01)

(52) U.S. Cl. ........ 318/649; 318/687; 318/560; 318/686; 310/12.01; 310/36; 310/10; 310/13; 310/15; 414/806; 414/788; 248/406.2; 248/913; 173/162.1

(58) Field of Classification Search .......... 318/34, 318/38, 119, 560, 567, 649, 611, 687, 568.1, 318/632; 310/12.01, 36, 10, 13, 15; 248/406.2; 248/913; 414/806, 788
See application file for complete search history.

(56) References Cited

U.S. PATENT DOCUMENTS

| | | | | |
|---|---|---|---|---|
| 5,959,427 A * | 9/1999 | Watson | ......................... | 318/687 |
| 6,304,320 B1 * | 10/2001 | Tanaka et al. | .................... | 355/73 |
| 6,359,679 B1 * | 3/2002 | Ito et al. | ........................... | 355/75 |
| 6,493,062 B2 * | 12/2002 | Tokuda et al. | .................. | 355/53 |
| 6,621,241 B2 * | 9/2003 | Reid et al. | ....................... | 318/114 |
| 6,654,098 B2 * | 11/2003 | Asano et al. | ...................... | 355/53 |
| 6,654,100 B2 * | 11/2003 | Yoda | ................................ | 355/53 |
| 6,721,041 B2 * | 4/2004 | Tanaka | ............................. | 355/72 |
| 6,788,385 B2 * | 9/2004 | Tanaka et al. | ................... | 355/53 |
| 6,819,404 B2 * | 11/2004 | Tanaka | ............................. | 355/72 |
| 6,844,694 B2 * | 1/2005 | Binnard | ........................ | 318/649 |
| 6,879,375 B1 * | 4/2005 | Kayama | .......................... | 355/53 |
| 6,891,597 B2 * | 5/2005 | Sekiguchi | ........................ | 355/53 |
| 6,894,763 B2 * | 5/2005 | Murakami et al. | .............. | 355/53 |

FOREIGN PATENT DOCUMENTS

| | | |
|---|---|---|
| JP | 8-288198 | 11/1996 |
| JP | 11-329962 | 11/1999 |
| JP | 2000-170827 | 6/2000 |
| JP | 2005-057876 | 3/2005 |

\* cited by examiner

*Primary Examiner* — Rita Leykin
(74) *Attorney, Agent, or Firm* — Squire, Sanders & Dempsey (US) LLP

(57) ABSTRACT

Increasing in size of a reaction force cancel system is suppressed. The reaction force cancel system is provided in a stage device including: a surface plate having a plurality of plate surfaces with different heights from each other, and installed on a floor via a vibration-isolating spring; and stages disposed on the plate surfaces respectively, and moving on the plate surfaces, and cancels reaction forces generated on the surface plate upon movements of the stages. In addition, the reaction force cancel system includes a first and a second reaction force canceling actuator that apply counter-thrusts to the surface plate, and a control section that controls the magnitudes of the counter-thrusts. In the reaction force cancel system, the heights of action points of counter-thrusts in the surface plate are different from each other, and the control section controls the counter-thrusts so as to counterbalance the reaction forces as resultant forces and resultant moments.

5 Claims, 3 Drawing Sheets

REACTION FORCE CANCEL SYSTEM

BACKGROUND OF THE INVENTION

1. Field of the Invention

The present invention relates to a reaction force cancel system for improving the stabilization of stages in a movable stage apparatus.

2. Related Background of the Invention

Conventionally, a movable stage apparatus including: a surface plate having a plurality of plate surfaces with different heights from each other, and installed on a base via a vibration-isolating section; and a plurality of stages that move on respective plate surfaces in the surface plate has been in use as an exposure apparatus for semiconductors and liquid crystals, for example. In such a movable stage apparatus, a higher acceleration and deceleration of the stages has been sought for purpose of improving throughput per unit time, for example. However, if the stages are highly accelerated or decelerated, there is a risk that there may be an increase in reaction forces generated in the surface plate upon movements of the stages, and thus the stabilization of the stages may become worse.

Thus, in recent years, a reaction force cancel system has been developed, which is described, for example, in Japanese Patent Application Laid-Open No. 2000-40650. In the reaction force cancel system, an attempt has been made to counterbalance a plurality of reaction forces generated in the surface plate upon movements of a plurality of stages (reticle stage and wafer stage) by applying forces (variable thrusts) for counterbalancing the reaction forces by means of a first application device (force actuator) and a second application device (horizontal force actuator) to the surface plate (mirror cylinder surface plate and reticle stage surface plate), respectively.

SUMMARY OF THE INVENTION

Incidentally, in order to prevent moments from being generated in a surface plate by the effect of reaction forces, it is general to allow the heights of action points of the reaction forces to coincide with the heights of action points of forces for counterbalancing the reaction forces. Therefore, in the reaction force cancel system as described above, a plurality of application devices is provided in the movable stage apparatus so that the heights of action points of a plurality of reaction forces and the heights of action points of the forces to be applied thereto coincide with each other. However, if the heights of action points of reaction forces are high, it is required to place the application devices at high positions, and a reaction force cancel system may become bigger in size.

Thus, it is an object of the present invention to provide a reaction force cancel system that can suppress an increase in size.

In order to achieve the above-mentioned object, a reaction force cancel system according to the present invention is the one provided in a stage device including: a surface plate having a plurality of plate surfaces with different heights from each other, and installed on a base via a vibration-isolating section; and a plurality of stages that are disposed on the plate surfaces respectively and move on the plate surfaces, for canceling a plurality of reaction forces generated in the surface plate upon movements of the stages, the system comprising: a first and a second application device that apply each of a first and a second force to the surface plate for canceling the plurality of reaction forces cooperatively; and a control device that controls magnitudes of the first and second forces; wherein heights of action points of the first and second forces in the surface plate are different from each other; and the control section controls the first and second forces so as to counterbalance the plurality of reaction forces as resultant forces and resultant moments.

In the reaction force cancel system, the heights of action points of the first and second forces in the surface plate are different from each other. In addition, the control device controls the first and second forces so as to counterbalance the plurality of reaction forces as resultant forces and resultant moments. Therefore, the necessity will be eliminated for allowing each of the heights of action points of forces to be applied thereto to coincide with the heights of action points of the plurality of reaction forces generated in the surface plate, in order for moments not to be generated in the surface plate, when the plurality of stages moves respectively on the plurality of plate surfaces with different heights from each other. That is, even if the plurality of reaction forces is generated in the surface plate, when the plurality of stages moves on the plurality of plate surfaces, respectively, these reaction forces can be canceled only by the first and second application devices. Along with these, if positions have different heights from each other, it becomes possible to arrange the first and second application devices at free positions. As a result, increasing in size of the reaction force cancel system can be suppressed, and it becomes furthermore possible to suppress an increase in size of the movable stage apparatus.

Here, the first and second application devices are preferably arranged between the plate surface of the surface plate and the base such that the surface plate hangs over the application devices. In this case, the space for the plate surface of the surface plate is secured sufficiently, and increasing in size of the installed area (so-called footprint) of the movable stage apparatus is suppressed. Consequently, the space for the movable stage apparatus can be efficiently utilized, and it becomes possible to further suppress an increase in size of the movable stage apparatus.

In addition, at least one of the first application device and second application device may be provided between the bottom face of the surface plate and the base.

Also, a reaction force cancel system according to the present invention is the one provided on a stage device including: a surface plate having a plurality of plate surfaces with different heights; and a plurality of stages moving on the plate surfaces, for canceling a plurality of reaction forces generated in the surface plate upon movements of the stages, the system comprising: a first and a second actuator that apply each of a first and a second force to the surface plate; and a control device that controls magnitudes of the first and second forces; wherein heights of action points of the first and second forces in the surface plate are different from each other; and the control device computes the plurality of reaction forces and the first and second forces in terms of forces with respect to a center of gravity of the stage device, and then cancels the plurality of reaction forces based on the result of this computation.

At this time, the control device has a controller that controls both of drive control of the stages and the first and second actuators, and the thrusts of the first and second actuators are preferably calculated based on drive commands for the drive control of the stages.

DESCRIPTION OF THE PREFERRED EMBODIMENTS

Figure 1:
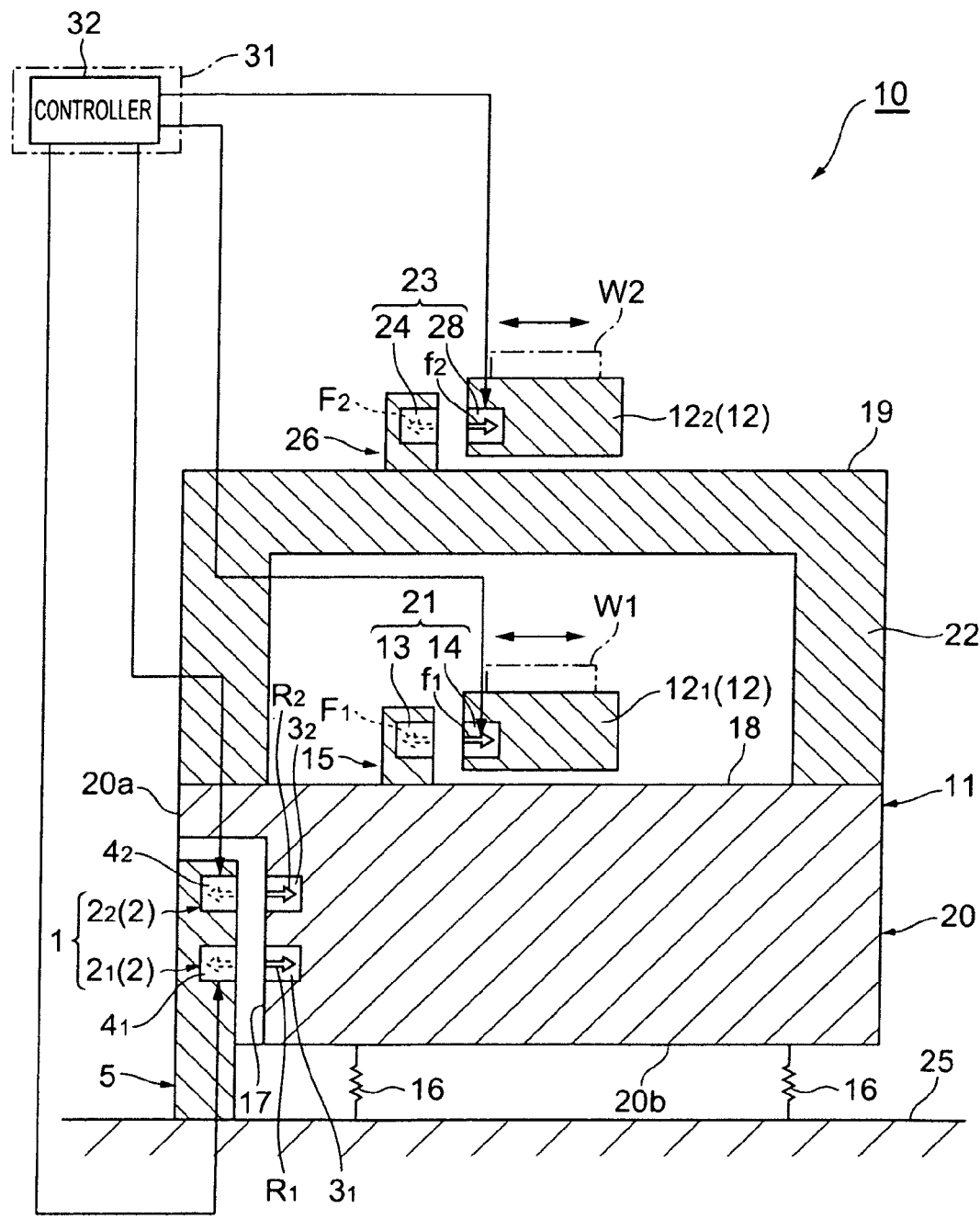
FIG. 1 is a schematic configuration view illustrating a section of a reaction force cancel system according to a first embodiment of the present invention.

Hereinafter, with reference to the accompanying drawings, preferred embodiments of the invention will now be described in detail. It is noted that in the description of drawings, the same reference numerals will be assigned to the same or equivalent elements, and the duplicate description will be omitted.

First, a movable stage apparatus including a reaction force cancel system according to a first embodiment of the present will be described. FIG. 1 is a schematic configuration view illustrating a section of the movable stage apparatus including the reaction force cancel system according to a first embodiment of the present invention. As illustrated in FIG. 1, a movable stage apparatus 10 is employed as, for example, an exposure apparatus for semiconductors, and includes a surface plate 11, stages 12, and a reaction force cancel system 1.

The surface plate 11 is installed to be supported on a floor (base) 25 via vibration-isolating springs (vibration-isolating sections) 16, 16, thereby being insulated against vibration (particularly, high-frequency vibration) from the floor 25. The surface plate 11 exhibits a hierarchical structure so as to have a plurality of (here, two) plate surfaces 18, 19 with different heights from each other. More specifically, the surface plate 11 is provided on the floor 25, and has a first surface plate section 20 including the plate surface 18, and a second surface plate section 22 including the plate surface 19 provided on the first surface plate section 20.

The first surface plate section 20 is formed of a stone, for example, in order to prevent deformation due to heat. In a side face 20a of this first surface plate section 20, a recessed section 17 is formed to open into the side face 20a and an underside face (bottom face) 20b, and the reaction force cancel system 1 is provided in the recessed section 17 (as will be described later in detail). For example, ceramics are used for the second surface plate section 22.

Stages 12 have a first stage $12_1$ disposed on the plate surface 18, and a second stage $12_2$ disposed on the plate surface 19. On the first stage $12_1$, for example, a semiconductor wafer W1 is placed, and on the second stage $12_1$, for example, a semiconductor mask W2 is placed. These stages $12_1$, $12_2$ are designed to be movable in a horizontal direction (left to right direction as shown in the figure) on the plate surfaces 18, 19, respectively, by a guide means (not shown) such as an air bearing. Then, the stages $12_1$, $12_2$ are driven by stage actuators 21, 23, respectively, to allow each on the plate surfaces 18, 19 to move in a horizontal direction.

The stage actuator 21 is provided in a stay 15 on the plate surface 18, and configured to include a stator 13 made of, for example, a permanent magnet, and a movable element 14 provided on the first stage $12_1$ and made of, for example, a magnetic coil. The stator 13 and the movable element 14 are arranged contactlessly with each other. In addition, the stage actuator 23 is provided in a stay 26 on the plate surface 19, and includes a stator 24 made of, for example, a permanent magnet, and a movable element 28 provided on the second stage $12_2$ and made of, for example, a magnetic coil, wherein the stator 24 and the movable element 28 are arranged contactlessly with each other.

A control section (control device) 31 is connected to these stage actuators 21, 23, and magnetic forces are generated between the stator 13 and the movable element 14 and between the stator 24 and the movable element 28, respectively, by supplying drive currents from the control section 31 to the movable elements 14, 28. As a result, thrusts (forces) are applied by the generated magnetic forces to each of the movable element 14, 28, and each of the stages $12_1$, $12_2$ is driven.

The control section 31 is configured by, for example, CPU, ROM, and RAM, etc., and has a controller 32. The controller 32 controls the movements of the stages 12 by controlling each of drive currents that are supplied to the stage actuators 21, 23.

Here, in the embodiment, as described above, a reaction force cancel system 1 is provided in a recessed section 17 of the first surface plate section 20. Specifically, the recessed sections 17 are formed at two locations (eight locations in total formed) for each of four side faces of the first surface plate section 20, and the reaction force cancel system 1 is provided for each of these recessed sections 17. It is noted that, only a recessed section 17 formed in the side face 20a of the first surface plate section 20 and the reaction force cancel system 1 provided in this recessed section 17 are illustrated in the figure, for convenience of illustration.

The reaction force cancel system 1 is an system for canceling a reaction force $F_1$ generated in the surface plate 11 upon movement of the stage $12_1$, and a reaction force $F_2$ generated in the surface plate 11 upon movement of the stage $12_2$, and includes reaction force canceling actuators 2. The reaction force canceling actuators 2 are configured to include a first reaction force canceling actuator (a first application device) $2_1$, and a second reaction force canceling actuator (a second application device) $2_2$ provided at a position with different height relative to the first reaction force canceling actuator.

The first reaction force canceling actuator $2_1$, is to apply a first counter-thrust (a first force) $R_1$ that is a force for canceling a reaction force cooperatively to the surface plate 11, and has a movable element $3_1$ made of, for example, a permanent magnet, and a stator $4_1$ made of, for example, a magnetic coil. The movable element $3_1$ is attached to the first surface plate section 20, and the stator $4_1$ is attached to a pillar-like stationary frame 5 installed on the floor 25. The movable element $3_1$ and the stator $4_1$ are configured to be contactless with each other. In addition, the first reaction force canceling actuator $2_1$ is connected to the control section 31, and a drive current is supplied from the control section 31 to the stator $4_1$, thereby a magnetic force is generated between the movable element $3_1$ and the stator $4_1$, and a counter-thrust $R_1$ is generated in turn by the magnetic force in the movable element $3_1$.

A second reaction force canceling actuator $2_2$ is the one to apply a second counter-thrust $R_2$ that is a force for canceling a reaction force cooperatively to the surface plate 11, and is provided at an upper position than the first reaction force canceling actuator $2_1$. The second reaction force canceling actuator $2_2$ has a movable element $3_2$ made of, for example, a permanent magnet, and a stator $4_2$ made of, for example, a magnetic coil. The movable element $3_2$ is attached at an upper position than the above-mentioned movable element $3_1$ in the first surface plate section 20, and a stator $4_2$ is attached at an upper end side than the above-mentioned stator $4_1$ on a stationary frame 5. That is, the heights of action points of the first and second counter-thrust $R_1$, $R_2$ in the surface plate 11 are different from each other. Moreover, the movable element $3_2$ and the stator $4_2$ are configured to be contactless with each other. Also, the second reaction force canceling actuator $2_2$ is connected to the control section 31, and a drive current is supplied from the control section 31 to the stator 4₂, thereby a magnetic force is generated between the movable element 3₂ and the stator 4₂, and a counter-thrust $R_2$ is generated by the magnetic force in the movable element 3₂.

The stationary frame 5 is arranged within the recessed section 17 such that the first surface plate section 20 hangs over the stationary frame 5, and designed to be covered by the recessed section 17 of the first surface plate section 20. In other words, the movable elements 3₁, 3₂ and the stators 4₁, 4₂ are arranged between the plate surface 18 of the first surface plate section 20 and the floor 25 such that the first surface plate section 20 hangs over these movable elements and stators.

Figure 2:
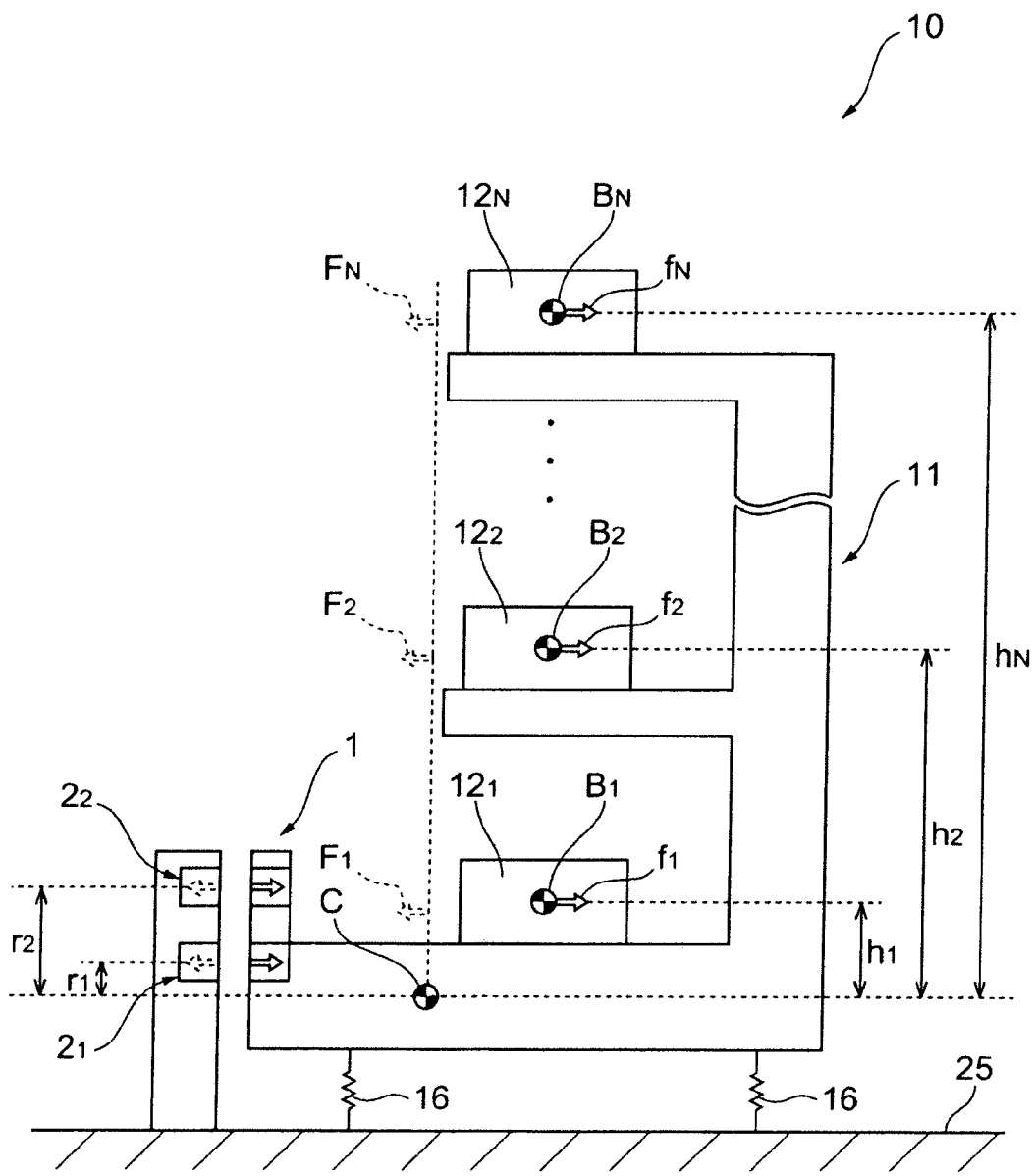
FIG. 2 is a view illustrating a dynamics model of a movable stage apparatus in FIG. 1.

Here, the control section 31 controls the magnitudes of the first and second counter-thrusts $R_1$, $R_2$ by controlling each of drive currents to be supplied to the reaction force canceling actuators 2₁, 2₂. More specifically, a controller 32 of the control section 31 controls the first and second counter-thrusts $R_1$, $R_2$ so as to cancel the reaction forces $F_1$, $F_2$ as resultant forces and resultant moments. Now, the control of the first and second counter-thrusts $R_1$, $R_2$ by the control section 31 will be described in detail as follows:

First, as illustrated in FIG. 2, a movable stage apparatus 10 is modeled assuming that a surface plate has N (N is integer of two or more) plate surfaces with different heights from each other, and N stages 12ₙ move on each plate surface. Let a plurality of reaction forces generated by the movements of respective stages 12ₙ in the surface plate 11 to be, $F_i$ (i=1 to N hereafter the same will apply), masses of respective stages 12ₙ to be $M_i$, accelerations to be $A_i$, respective distances from the height of center of gravity C of the movable stage apparatus to the heights of action points $B_i$ of reaction forces $F_i$ to be $h_i$, respective distances from the height of the movable stage apparatus 10 to the heights of action points of counter-thrusts $R_1$, $R_2$ to be $r_1$, $r_2$. At this time, the expression of the reaction forces $F_i$ is given by the equation (1) as:

[Formula 1]

$$F_i = M_i A_i \quad (1)$$

The balance of forces acting on the surface plate by reaction forces $F_i$ is given by the equation (2) as:

[Formula 2]

$$\sum_{i=1}^{N} F_i = R_1 + R_2 \quad (2)$$

The balance of moments acting on the surface plate by reaction forces $F_i$ is given by the equation (3) as:

[Formula 3]

$$\sum_{i=1}^{N} F_i = R_1 r_1 + R_2 r_2 \quad (3)$$

Based on the above-mentioned (2), (3), a first and a second counter-thrust $R_1$, $R_2$ are given by the equation (4) as:

[Formula 4]

$$R_1 = -\frac{\sum_{i=1}^{N} M_i A_i h_i - r_2 \sum_{i=1}^{N} M_i A_i}{r_2 - r_1} \quad (4)$$

$$R_2 = \frac{\sum_{i=1}^{N} M_i A_i h_i - r_1 \sum_{i=1}^{N} M_i A_i}{r_2 - r_1}$$

Therefore, in the present embodiment, if respective distances $r_1$, $r_2$ from the height of the center of gravity C of the movable stage apparatus 10 to the heights of action points of the counter-thrusts $R_1$, $R_2$ are set as, for example, design values, the counter-thrusts $R_1$, $R_2$ are controlled by the control section 31 so as to meet the above-mentioned equation (4), and thus the reaction forces $F_1$, $F_2$ will be counterbalanced as resultant forces and resultant moments.

In the movable stage apparatus 10 as configured in this manner, drive currents are applied to the stage actuators 21, 23 by the control section 31, respectively, and thrusts $f_1$, $f_2$ depending on the applied respective drive currents are generated by respective stage actuators 21, 23, the stages 12₁, 12₂ are driven by these thrusts $f_1$, $f_2$, respectively.

At this time, the thrusts $f_1$, $f_2$ act on the stages 12₁, 12₂, thereby, the reaction forces $F_1$, $F_2$ that are forces in opposite direction to the thrusts $f_1$, $f_2$ and with the same magnitude act onto the surface plate 11 resulting from their reaction. Thus, in the present embodiment, the counter-thrusts $R_1$, $R_2$ are generated by reaction force canceling actuators 2₁, 2₂, respectively, as well as the counter-thrusts $R_1$, $R_2$ are controlled so as to meet the above-mentioned equation (4) by the control section 31. Thereby, the reaction forces $F_1$, $F_2$ will be counterbalanced as resultant forces and resultant moments.

Therefore, because moments are not generated in the surface plate 11, the necessity will be eliminated for allowing the heights of action points of the counter-thrusts $R_1$, $R_2$ to coincide with the heights of action points of respective reaction forces $F_1$, $F_2$ acting on the surface plate 11, respectively. Consequently, even when a plurality of reaction forces is generated in the surface plate 11, the reaction forces can be canceled only by the first reaction force canceling actuator 2₁ and the second reaction force canceling actuator 2₂. Along with this, with positions with different heights from each other, it becomes possible to arrange the reaction force canceling actuators 2₁, 2₂ at free positions, without being constrained. As a result, increasing in size of the reaction force cancel system 1 can be suppressed, and it becomes furthermore possible to suppress an increase in size of the movable stage apparatus 10.

In addition, as described above, due to the fact that the necessity will be eliminated for allowing the heights of action points of the counter-thrusts R1, R2 to coincide with the heights of action points of respective reaction forces F1, F2 acting on the surface plate 11, respectively, the height of the stationary frame 5 of the reaction force cancel system 1 can be lowered, and consequently, the necessity will be eliminated for increasing its rigidity in order to prevent the deflection of the stationary frame 5. As a result, increased mass of the stationary frame 5 that would result from enhancing the rigidity can be suppressed. That is, lighter weight of the reaction force cancel system 1 becomes possible.

Also, in the present embodiment, as described above, the reaction force canceling actuators 2₁, 2₂ are arranged between the surface plate 18 of the first surface plate section 20 and the floor 25 such that the first surface plate section 20 hangs over the reaction force canceling actuators. For this reason, the space for the plate surface 18 of the surface plate 11 is sufficiently secured, as well as the increase in installed area (so-called footprint) of the movable stage apparatus 10 is suppressed. Consequently, the space of the movable stage apparatus 10 can be efficiently utilized, and the increase in size of the movable stage apparatus 10 can be further suppressed.

Further, in the present embodiment, as described above, even if it is impossible due to insufficient space to bring the heights of action points of the reaction force $F_1$, $F_2$ in line with the heights of action points of the counter-thrusts $R_1$, $R_2$, respectively, when mounting the reaction force cancel system 1 on existing movable stage apparatus, it becomes possible to reliably apply the reaction force cancel system 1, due to the fact that the reaction force canceling actuators $2_1$, $2_2$ can be arranged at free positions.

Additionally, in the present embodiment, as described above, because the movable element $3_1$ and the stator $4_1$ are designed to be contactless with each other in the first reaction force canceling actuator $2_1$, while the movable element $3_2$ and the stator $4_2$ are designed to be contactless with each other in the second reaction force canceling actuator $2_2$, vibration from the floor 25 is prevented from propagating to the surface plate 11 via the reaction force canceling actuator 2. Also, as described above, permanent magnets serving as the movable elements $3_1$, $3_2$ are attached to the surface plate 11, respectively, as well as the magnetic coils serving as the stators $4_1$, $4_2$ are attached to the stationary frame 5, respectively, the influence of heat generation caused by applying drive currents to the magnetic coils of the stators $4_1$, $4_2$ is prevented from extending into the surface plate 11.

It is noted that, in order for the timing at which the counter-thrusts $R_1$, $R_2$ are generated to correspond with the timing at which the reaction forces $F_1$, $F_2$ are generated, it is preferable to determine the timing at which the reaction force cancel system 1 is operated based on the timing at which the stages $12_1$, $12_2$ are accelerated. Therefore, in the control section 31 of the present embodiment, the stage actuators 21, 23 and the reaction force canceling actuators $2_1$, $2_2$ are controlled by a single controller 32.

Figure 3:
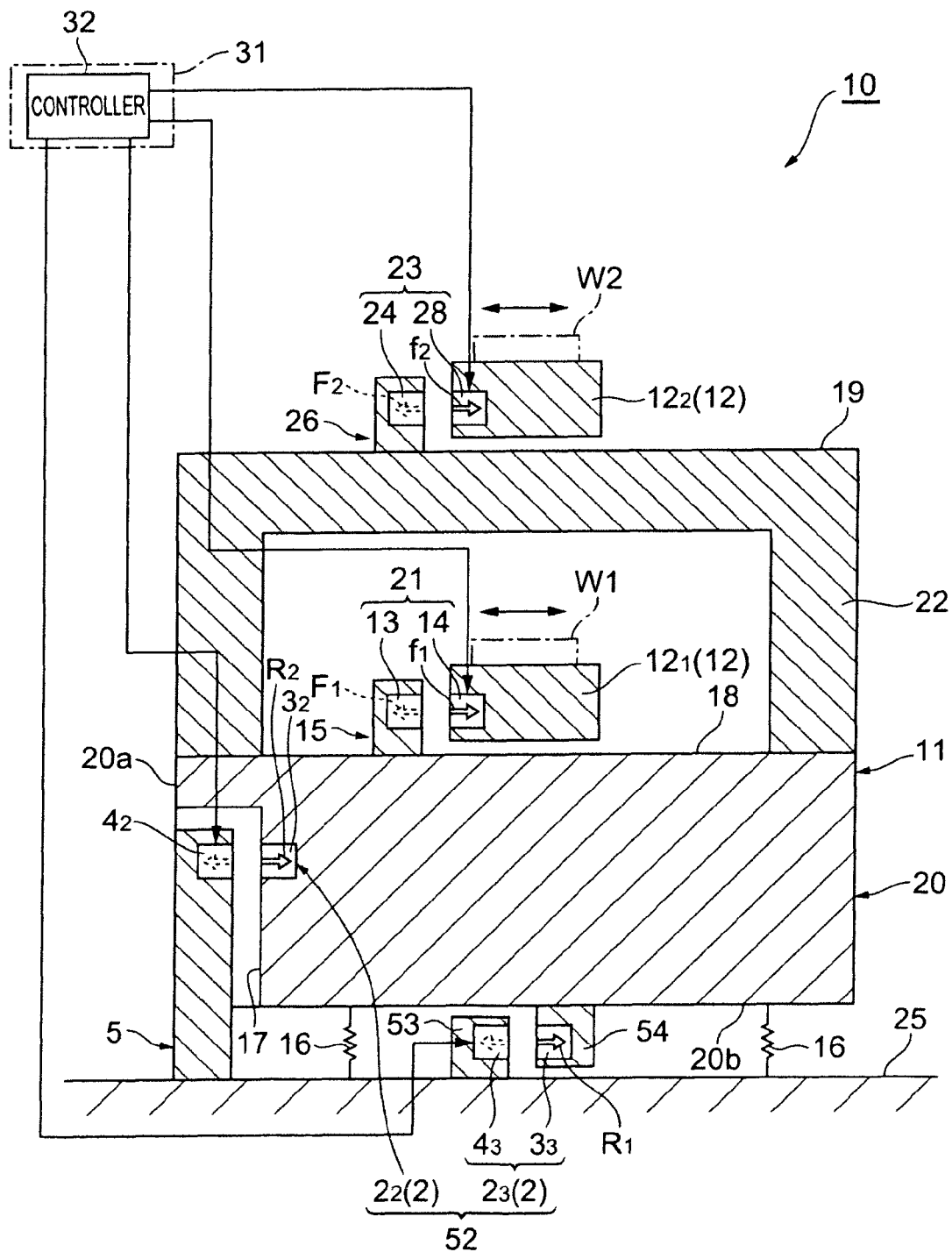
FIG. 3 is a schematic configuration view illustrating a section of a reaction force cancel system according to a second embodiment of the present invention.

Next, a movable stage apparatus including a reaction force cancel system according to a second embodiment of the present invention will be described. FIG. 3 is a schematic configuration view illustrating a section of a movable stage apparatus including the reaction force cancel system according to the second embodiment of the present invention. The point where a movable stage apparatus 50 of the present embodiment differs from the movable stage apparatus 10 (Refer to FIG. 1) of the above-mentioned embodiment, is that a reaction force canceling actuator 52 equipped with a first reaction force canceling actuator $2_3$ is provided as a substitute for a reaction force cancel system 1 equipped with the first reaction force canceling actuator $2_1$.

The first reaction force canceling actuator $2_3$ is provided between the underside face 20b of the first surface plate section 20 and the floor 25, and has a movable element $3_3$ made of, for example, a permanent magnet, and a stator $4_3$ made of, for example, a magnetic coil. The movable element $3_3$ is attached to a stay 54 of the underside face 20b of the first surface plate section 20, while the stator $4_3$ is attached to a pillar-like stationary frame 53 installed on the floor 25. Further, in the first reaction force canceling actuator $2_3$, the movable element $3_3$ and the stator $4_3$ are configured to be contactless with each other.

Also in the present embodiment, the same effect as the above-mentioned embodiments, that is, the effect of suppressing an increase in size of the reaction force cancel system 1 and furthermore an increase in size of the movable stage apparatus 10 will be achieved.

Up to this point, preferred embodiments of the present invention have been described, however the present invention is not limited to the above-mentioned embodiments.

For example, in the above-mentioned embodiments, the surface plate 11 has two plate surfaces 18, 19 with different heights from each other, but it may have three or more plate surfaces with different heights from each other.

Also, in the above-mentioned embodiments, the stators 13, 24 of the stage actuators 21, 23 are formed of permanent magnets, and the movable elements 14, 28 are formed of magnetic coils, although the stators may be formed of magnetic coil, and the movable elements may be formed of permanent magnets. It is noted that, in this case, that drive currents from the control section 31 are supplied to the stators serving as magnetic coils. Also, in the above-mentioned embodiments, movable elements $3_1$, $3_2$, $3_3$ of reaction force canceling actuators $2_1$, $2_2$, $2_3$ are formed of permanent magnets, stator $4_1$, $4_2$, $4_3$ are formed of magnetic coils, although the movable elements may be formed of magnetic coils, the stators may be formed of permanent magnets. In this case, drive currents from the control section 31 are supplied to the movable elements serving as magnetic coils.

Also, in the above-mentioned embodiments, the surface plate 11 is installed on the floor 25 via vibration-isolating springs 16, 16, although they may be installed via other mechanical springs, air springs, or the like may be used, and it is essential only that surface plate 11 be installed via the one that insulates against vibration from the floor 25 (vibration-isolating section).

Also, in the above-mentioned embodiments, the reaction force cancel system 1 is provided in two locations for each of four side faces of the first surface plate section 20 (eight locations in total), although the reaction force cancel system 1 may be provided in various arrangement patterns. In addition, in the above-mentioned embodiments, the movable stage apparatus 10 is employed for a semiconductor exposure apparatus, although it may be employed for a liquid crystal exposure apparatus for exposing liquid crystals, and a machine tool and a manufacturing equipment having a plurality of stages.

According to the present invention, increasing in size of the reaction force cancel system can be suppressed. As a result, it becomes possible to suppress an increase in size of the movable stage apparatus.

What is claimed is:

1. A reaction force cancelation system provided in a stage device, the stage device comprising a surface plate having a plurality of plate surfaces with different heights from each other, and installed on a base via a vibration-isolating section, and a plurality of stages that are disposed on the plate surfaces respectively and move on the plate surfaces, the system configured to cancel a plurality of reaction forces generated in the surface plate upon movements of the stages, the system comprising:

a first and a second application device configured to apply each of a first and a second force to the surface plate to cancel the plurality of reaction forces cooperatively; and a control device configured to control magnitudes of the first and second forces;

wherein heights of action points of the first and second forces in the surface plate are different from each other; and wherein the control device is configured to controls the first and second forces so as to counterbalance the plurality of reaction forces as resultant forces and resultant moments based on a distance from a height of a center of gravity of the surface plate to a height of an action point of the plurality of reaction forces in each of the plurality of stages, a distance from the height of a center of gravity to a height of an action point of the first force, and a distance from the height of a center of gravity of the surface plate to a height of an action point of the second force.

2. The reaction force cancel system according to claim 1, wherein the first and second application device are arranged between the plate surface of the surface plate and the base such that the surface plate hangs over the application devices.

3. The reaction force cancel system according to claim 2, wherein at least one of the first and second application devices is provided between a bottom face of the surface plate and the base.

4. A reaction force cancelation system provided on a stage device, the stage device comprising a surface plate having a plurality of plate surfaces with different heights, and a plurality of stages moving on the plate surfaces, the system configured to cancel a plurality of reaction forces generated in the surface plate upon movements of the stages, the system comprising:

a first and second actuator configured to apply each of a first and a second force to the surface plate; and a control device configured to control magnitudes of the first and second forces;

wherein heights of action points of the first and second forces in the surface plate are different from each other; and wherein the control device computes the plurality of reaction forces and the first and second forces in terms of forces with respect to a center of gravity of the stage device, and then cancels the plurality of reaction forces based on the result of the computation and on a distance from a height of a center of gravity of the surface plate to a height of an action point of the plurality of reaction forces in each of the plurality of stages, a distance from the height of a center of gravity to a height of an action point of the first force, and a distance from the height of a center of gravity of the surface plate to a height of an action point of the second force.

5. The reaction force cancel system according to claim 4, wherein the control device has a controller that controls both of drive control of the stages and the first second actuators; and thrusts of the first and second actuators are calculated based on drive commands for the drive control of the stages.

* * * * *